(12) United States Patent
Koay et al.

(10) Patent No.: US 7,760,577 B1
(45) Date of Patent: Jul. 20, 2010

(54) PROGRAMMABLE POWER DOWN SCHEME FOR EMBEDDED MEMORY BLOCK

(75) Inventors: Wei Yee Koay, Bayan Baru (MY); Teng Chow Ooi, Telik Wanjah Alor Setar Kedah Darul Aman (MY); Ngee Kiat Chieng, Kulim (MY); Yau Kok Lai, Jalan Junid (MY); Mei Ching Lim, Mantin (MY)

(73) Assignee: Altera Corporation, San Jose, CA (US)

( * ) Notice: Subject to any disclaimer, the term of this patent is extended or adjusted under 35 U.S.C. 154(b) by 124 days.

(21) Appl. No.: 12/212,768

(22) Filed: Sep. 18, 2008

(51) Int. Cl.
*G11C 7/00* (2006.01)
(52) U.S. Cl. .......................... 365/226; 365/63; 365/227
(58) Field of Classification Search .................... 365/63, 365/226, 227
See application file for complete search history.

(56) References Cited

U.S. PATENT DOCUMENTS 5,321,646 A * 6/1994 Tomishima et al. ........... 365/51

* cited by examiner

*Primary Examiner*—Hoai V Ho
(74) *Attorney, Agent, or Firm*—Martine Penilla & Gencarella LLP

(57) ABSTRACT

An integrated circuit configured to selectively provide power to used portions of a memory array is presented. The integrated circuit includes an array of memory cells for storing digital data and a power bus interconnecting structure. The power bus interconnecting structure includes global power buses in communication with local power buses through programmable vias. The array of memory cells are remapped so that unused column portions of the memory array become unused row portions of the memory array. The programmable vias are selectively located during design of the integrated circuit, providing power to the used portions of the memory array.

20 Claims, 5 Drawing Sheets

FIG. 4A

| Add0 | Addn+1 | Addo+1 | Addp+1 |
|---|---|---|---|
| Add1 | Addn+2 | Addo+2 | Addp+2 |
| Add2 | Addn+3 | Addo+3 | Addp+3 |
| Add3 | Addn+4 | Addo+4 | Addp+4 |
| Add4 | Addn+5 | Addo+5 | Addp+5 |
| Add5 | Addn+6 | Addo+6 | Addp+6 |
| Add6 | Addn+7 | Addo+7 | Addp+7 |
| Add7 | Addn+8 | Addo+8 | Addp+8 |
| Add8 | Addn+9 | Addo+9 | Addp+9 |
| | | | |
| | | | |
| | | | |
| | | | |
| | | | |
| | | | |
| Addn | Addo | Addp | Addq |

Unused Bits 304

FIG. 4B

| Add0 | Add1 | Add2 | Add3 | Add4 | Add5 | Add6 | Add7 | Add8 | |
|---|---|---|---|---|---|---|---|---|---|
| | | | | | Addn | Addn+1 | Addn+2 | Addn+3 | Addn+4 | Addn+5 |
| Addn+6 | Addn+7 | Addn+8 | Addn+9 | | | | | | |
| Addo | Addo+1 | Addo+2 | Addo+3 | Addo+4 | Addo+5 | Addo+6 | Addo+7 | Addo+8 | Addo+9 |
| | | | | | Addp | Addp+1 | Addp+2 | Addp+3 | Addp+4 |
| Addp+5 | Addp+6 | Addp+7 | Addp+8 | Addp+9 | | | | | |
| | Addq | | | | | | | | |

Unused Bits 312

US 7,760,577 B1

PROGRAMMABLE POWER DOWN SCHEME FOR EMBEDDED MEMORY BLOCK

BACKGROUND OF THE INVENTION

Integrated circuit devices often contain a number of embedded memory arrays, each memory array having a predefined number of memory cells. The amount of utilization of the memory arrays varies depending on the application of the device. In many cases, the memory arrays are only partially utilized. These unused portions of the memory array unnecessarily use power, causing the total power used by the device to be higher than it would be otherwise. Transistor technology scaling aggravates the problem as leakage current increases significantly with the shrinking of the process node.

The size and number of memory arrays of a device are defined based on the expected target applications. For example, one thousand 8 kilobits (kb) (16 bits wide by 512 bits deep) memory arrays are embedded in a typical four million logic gate device. However, due to varied customer applications, the utilization of the memory arrays varies greatly. In an example, a design may need a number of 144 kb memory arrays, each memory array configured as 144 bits wide by 1 kb deep. Each of the 144 kb memory arrays may be configured by cascading nine 8 kb memory arrays (9×16 bits=144 bit wide). In this configuration, the memory utilization for each 8 kb memory array would be 12.5% (1 kb out of the 8 kb).

For applications that have low memory utilization and require low power dissipation, it is disadvantageous for the device to use the full amount of power when memory array resources are not fully used. As a result, there is a need to solve the problems of the prior art to provide a method and apparatus for reducing power used by an integrated circuit by providing power to selective portions of a memory array.

SUMMARY OF THE INVENTION

Broadly speaking, the present invention fills these needs by providing a method and apparatus for reducing the power dissipated by an integrated circuit by selectively providing power to used portions of the memory array.

In accordance with one aspect of the invention, an integrated circuit configured to selectively provide power to used portions of a memory array is provided. The integrated circuit includes an array of memory cells for storing digital data and a power bus interconnecting structure. The power bus interconnecting structure includes global power buses in communication with local power buses through programmable vias. The array of memory cells are remapped so that unused column portions of the memory array become unused row portions of the memory array. The programmable vias are selectively placed during design of the integrated circuit, providing power to the used portions of the memory array.

In accordance with another aspect of the invention, an integrated circuit prepared by a process to provide power to selected portions of a memory array is detailed. The process begins by disposing a global power bus in columns, which are coplanar with columns of memory cells in a memory array. A local power bus is disposed in rows coplanar with rows of memory cells in a memory array. To selectively provide power to portions of the memory array, each of the memory array addresses are remapped so that unused column portions of the memory array are mapped to unused row portions of the memory array. After remapping, a plurality programming vias are selectively placed to couple the local power bus to the global power bus. The position of the programming vias is determined by the intersection of the global power bus and the local power in rows of memory cells receiving power.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

FIG. 4A illustrates the logical memory representation of a physical memory array addressed in a column basis in accordance with one embodiment of the present invention.

FIG. 4B illustrates a logical memory representation after row remapping of the memory array of FIG. 4A in accordance with one embodiment of the present invention.

DETAILED DESCRIPTION

The following embodiments describe an apparatus and method for providing power to selected sections of a memory array in the context of structured application-specific integrated circuits (ASIC). It will be obvious, however, to one skilled in the art, that the present invention may be practiced without some or all of these specific details and that the present invention may be practiced with other types of integrated circuits. In other instances, well known process operations have not been described in detail in order not to unnecessarily obscure the present invention.

Before logical memory implementation of a structured ASIC, a logical memory representation provides the desired configuration of the embedded memory arrays. The logical memory representation provides information for programming of the memory array. During design, the logical memory representation is mapped to a logical memory representation of the memory array that includes the row and column addresses of the logical memory array that will be used to store digital data. Typically, the logical memory representation addresses do not contain specific row and column information and are mapped to a corresponding row and column address during the design of the memory array. As a result the memory array can be manufactured in a number of configurations. Typical configurations of the physical memory array have unused row portions or column portions.

Figure 1:
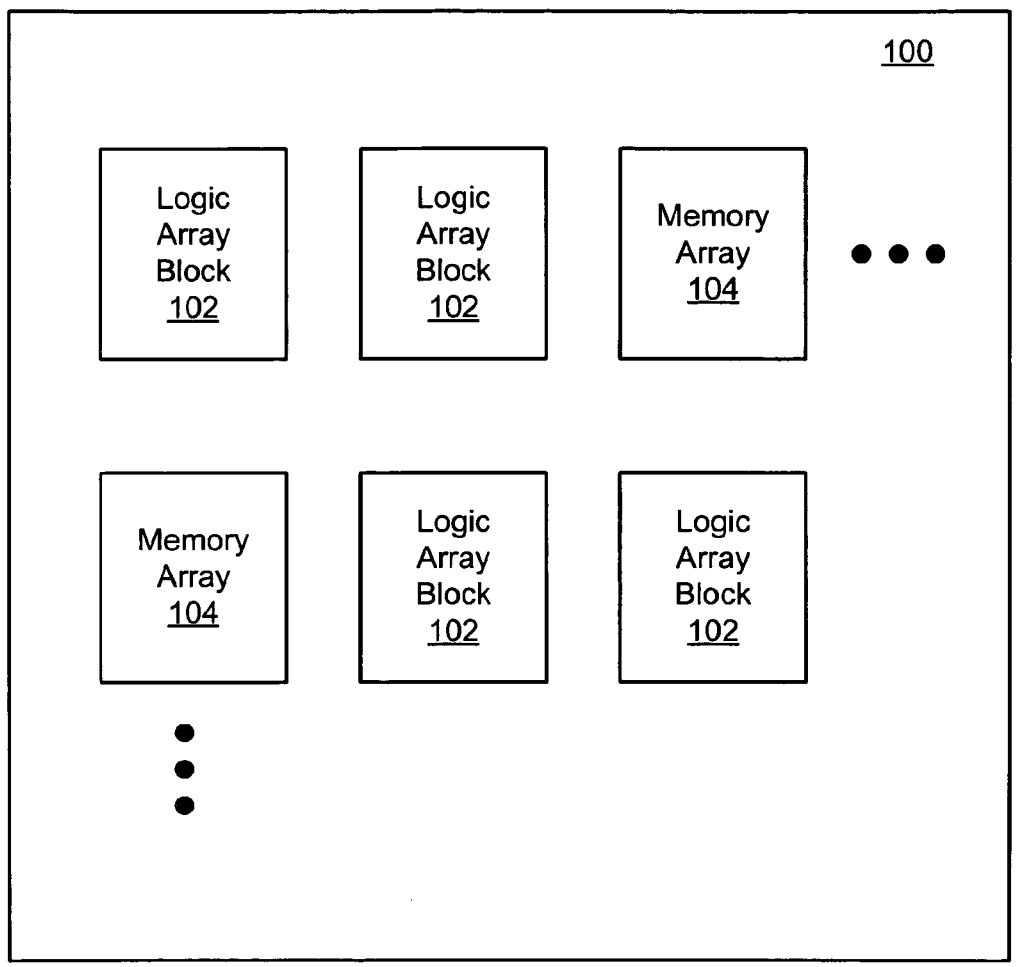
FIG. 1 illustrates a top view of a structured ASIC utilizing memory arrays with a programmable power down scheme in accordance with one embodiment of the present invention.

A programmable power down scheme is introduced to supply power to selected memory cells in a row by row basis. This programmable power down scheme allows for power optimization of the memory arrays and reduces the total chip power. FIG. 1 illustrates a top view of a structured ASIC utilizing memory arrays with a programmable power down scheme in accordance with one embodiment of the present invention. The structured ASIC 100 includes a number of logic array blocks 102 with a plurality of memory arrays 104. The memory arrays 104 are configured to the specifications for a specific application of the structured ASIC 100 and in cases where the memory array 104 is not fully utilized, unused portions of the memory array 104 will not receive power.

In one embodiment, the width of the data stored in the memory array 104 is dependent on the number of available columns in the memory array 104. In one instance, storing a 4-bit word would require four columns of the memory array 104. Implementing the programmable power down scheme on a row by row basis allows flexibility to configure the memory array 104 to store data of widths up to the maximum number of columns in the memory array 104 without changing existing memory addressing circuits or data paths.

Figure 2:
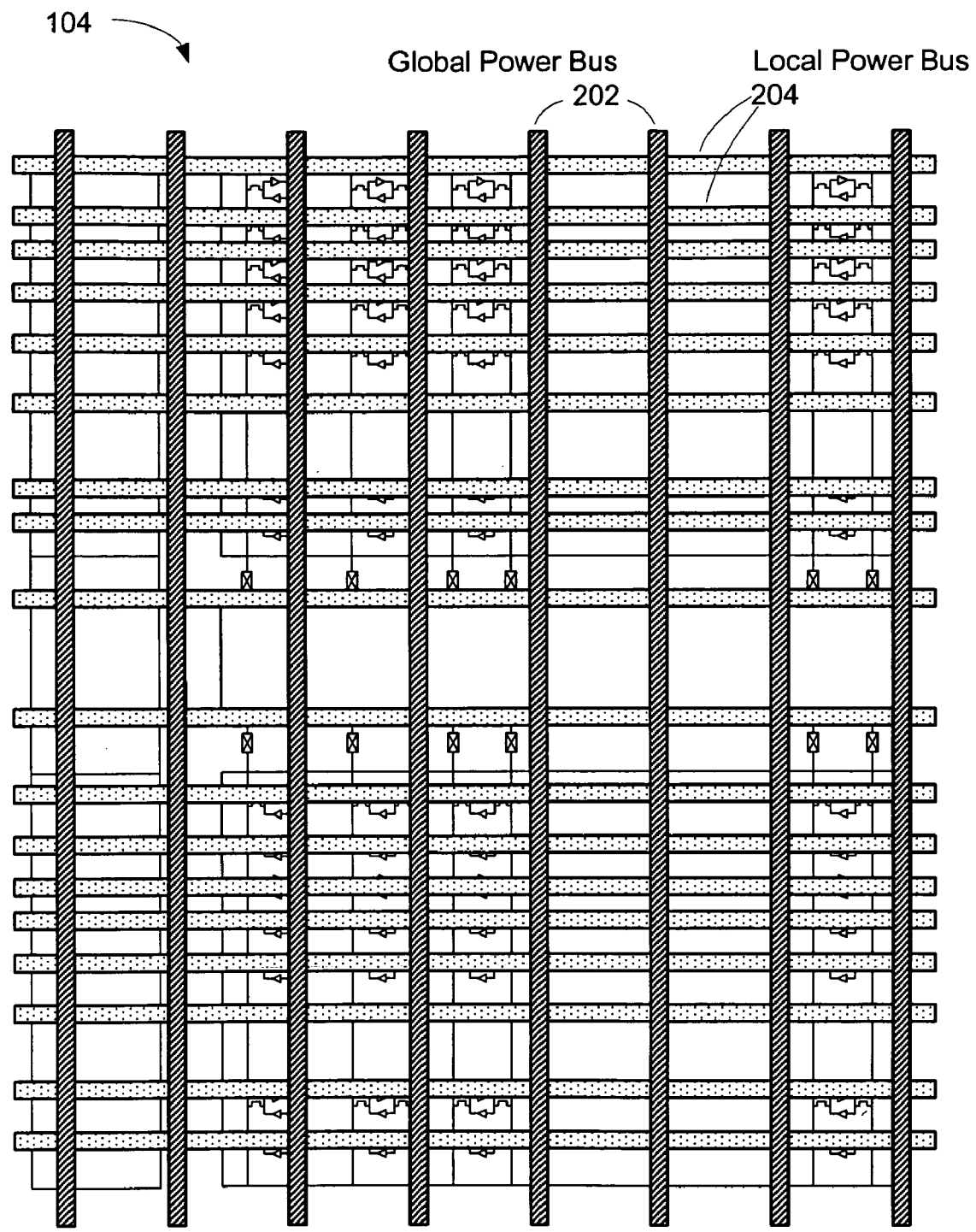
FIG. 2 illustrates a memory array utilizing a programmable power down scheme in accordance with one embodiment of the present invention.

FIG. 2 illustrates a memory array utilizing a programmable power down scheme in accordance with one embodiment of the present invention. Each memory array 104 within the structured ASIC consists of an array of memory cells, and the peripheral circuitry used to address the memory cells, as well as read and write digital data to the memory array 104. The memory array 104 is provided power through a power bus interconnecting structure, which includes global power buses 202 in electrical communication with the local power buses 204 through programmable vias. The local power bus 204 is disposed in rows coplanar with the rows of the memory array 104. The global power bus 202 is placed on a higher vertical plane relative to the local power bus 202 and is distributed in columns coplanar with the columns of the memory array 104.

The local power bus 204 is populated in the memory array 104 such that each row of memory cells has a dedicated local power bus 204, which is separate from the local power bus 204 of other rows. Each row of the memory cells is independently provided power through the use of programmable vias coupling the local power bus 204 to the global power bus 202. Conversely, a row of memory cells not in electrical communication with one of the programming vias does not receive power from the global power bus 204. By utilizing via programmability in the structured ASIC, each local power bus 202 can be selectively coupled to the global power bus 204 through selective placement of programmable vias. Depending on the required memory array configuration, unused rows of the memory array 104 may be configured not to receive power from the global power bus 202.

In one embodiment, the placement of programming vias is done by the mask programming concurrently with programming the logic array blocks of the structured ASIC. Selective placement of programming vias is implemented using metal/via masks used to program the logic array blocks of the structured ASIC device. These metal/via masks are changed for different designs.

Figure 3:
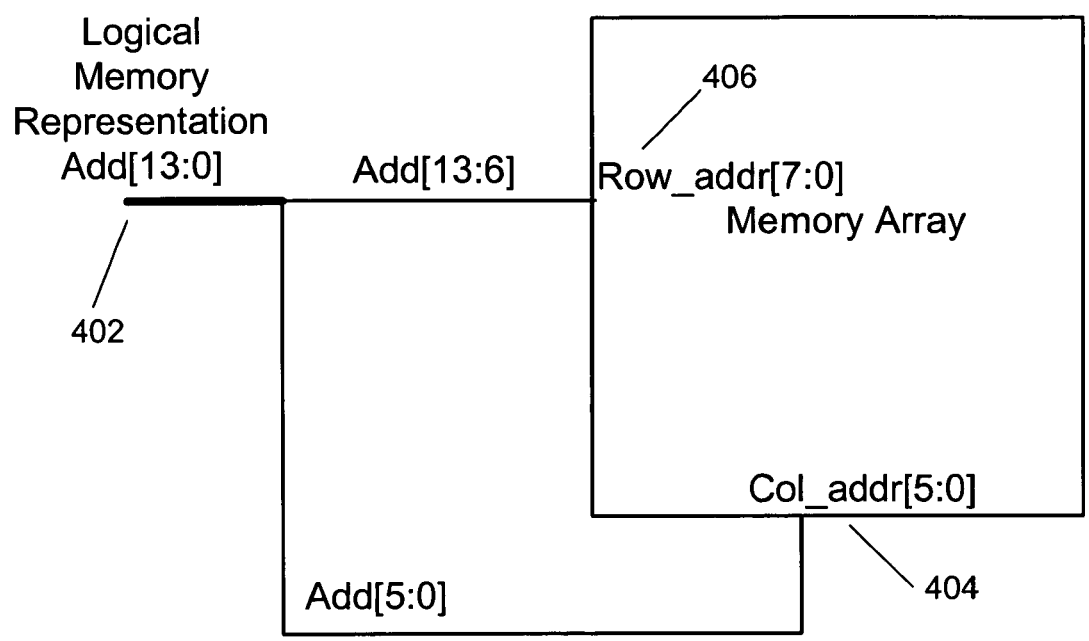
FIG. 3 illustrates mapping of a logical memory representation address to a physical representation address on a row basis in accordance with one embodiment of the present invention.

FIG. 3 illustrates mapping of a logical memory representation address to a physical representation address on a row basis in accordance with one embodiment of the present invention. Each memory address of the logical memory representation is mapped to a corresponding memory address of a row-based logical memory representation during design of the memory array. The mapping of the memory address 402 of the logical memory representation assigns the least significant bits (LSB) of the memory address 402 to a corresponding column address 404 of the memory array. The row mapping is performed by assigning the most significant bits of the memory array address 402 to a corresponding row address 406 of the memory array.

In another embodiment, a memory array that is configured to have 64 columns by 256 rows would have a 6-bit column address (Col_address[5:0]) 404 and 8-bit row address (Row_addr[7:0]) 406. For a memory address 402 of the logical memory representation consisting of 14 bits (logical memory representation address [13:0]), the six LSB of logical memory representation address [13:0] 402 are mapped to the corresponding column address (Col_addr[5:0]) 404 of the memory array. The remaining eight bits of the logical memory representation memory address (logical memory representation address [13:0]) 402 are mapped to the corresponding row address (Row_addr[7:0]) 406 of the memory array. By way of example, for a 14-bit logical memory representation address [13:0], the six LSB of logical memory representation address [5:0] is mapped to Coladdr[5:0] and the remaining bits, logical memory representation address[13:6] are mapped to Row_addr[7:0].

Implementing the programmable power down scheme in a row by row basis on a logical memory representation requires of the memory array to be addressed in a row basis. FIG. 4A illustrates the logical memory representation of a physical memory array addressed in a column basis in accordance with one embodiment of the present invention. If the logical memory representation 300 is identified as being addressed in a column basis 306 with a column portion of unused memory addresses 304, the addresses 302 of the column-based logical memory representation 300 are remapped to be configured in a row basis.

In one embodiment, to selectively provide power to the used portions 306 of the memory array, the memory allocation of the logical memory representation 300 is remapped from a column basis 306 to a row basis by remapping each row address to a corresponding column address. The memory addresses 302 are remapped such that the column address is accessed before the row address and the unused addresses of the memory array are remapped into rows 312.

In another embodiment, implementing the programmable power down scheme maps each memory address 302 of the logical memory representation 300 to the physical memory array in such a way that the physical memory array can be powered down on a row by row basis. To this end, memory addresses 302 are arranged such that columns are accessed first before rows. The used memory addresses 302 are grouped in rows, which will be provided power.

FIG. 4B illustrates a logical memory representation after row remapping of the memory array of FIG. 4A in accordance with one embodiment of the present invention. Implementation of the programmable power down scheme transforms a logical memory representation 300 with memory addresses 302 in a column basis shown in FIG. 3 to a logical memory representation 310 with memory addresses in a row basis 314.

Once the logical memory representation 310 has the memory addresses 302 in a row basis 314, the used row portion can be provided power through the local power bus by selectively coupling the local power bus to the global power bus. Rows of the logical memory representation 310 which are not fully utilized 312 do not receive the programming via and the unused portion 304 of memory addresses will not be provided power, thus reducing the power used by the memory array. Transformation of the logical memory representation 300 from a column basis 306 to a row basis 314 is done by assigning the row address 306 of the column-based logical memory representation 300 to a corresponding column address of the row-based logical memory representation 310 and assigning the column address of the column-based logical memory representation 300 to a corresponding row address of the row-based logical memory representation 310.

Figure 5:
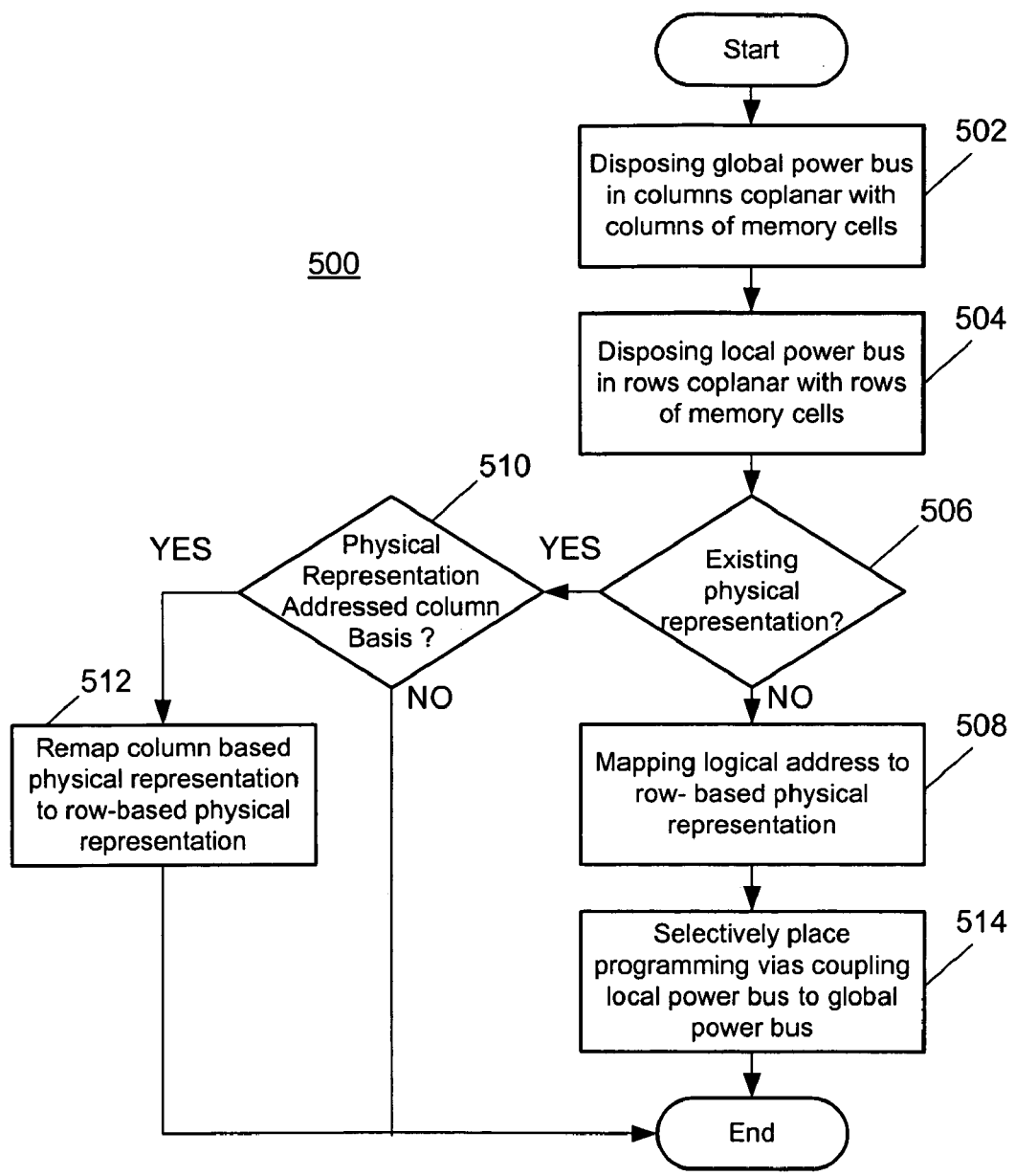
FIG. 5 is a flow chart diagram illustrating process operations for a programmable power down scheme for memory arrays, in accordance with one embodiment of the present invention.

FIG. 5 is a flow chart diagram illustrating process operations for a programmable power down scheme for memory arrays, in accordance with one embodiment of the present invention. The method 500 begins with operation 502, in which a global power bus is disposed in columns coplanar with columns of memory cells in a memory array. As illustrated in FIG. 2, the global power bus is arranged in columns above the columns of the memory cells of the memory array. The method then advances to operation 504 in which the local power bus is disposed in rows coplanar with rows of memory cells in a memory array, as illustrated in FIG. 2. Operations 502 and 504 create the power bus interconnecting structure of the memory array with the global power buses and the local power buses.

The method 500 advances to operation 506, where the method of implementing the programmable power down scheme depends on whether the memory addresses are identified as a column-based logical memory representation. A column-based logical memory representation proceeds to operation 508, while a row-based logical memory representation advances to operation 510.

In operation 508, the column-based logical memory representation is remapped to a row-based logical memory representation as illustrated in FIGS. 4A and 4B. For each memory location of the column-based logical memory representation, the column address is remapped to a corresponding row address of the row-based logical memory representation and the row address of the column-based logical memory representation is remapped to column address of the row-based logical memory representation.

In a row-based logical memory representation, as illustrated in FIG. 4B, the column addresses are accessed first and unused column portions of the memory array are mapped to unused row portions of the memory array. Each of memory addresses of the logical memory representation are mapped to the corresponding addresses of the memory by grouping the used portion of memory addresses of the logical memory representation in a row basis.

In one embodiment, the most significant bits of the logical memory representation memory addresses are mapped to the row address of the memory array, while the least significant bits are mapped to the column address of the memory array, as illustrated in FIG. 3. As a result of the mapping operation, the unused column portions of the memory array become unused row portions of the memory array.

In operation 510, the row-based logical memory representation of the memory array and selectively places a plurality of programming vias to couple the local power bus to the global power bus. The position of the programming vias is determined by the intersection of the global power bus and the local power bus at the row of memory cells receiving power. Conversely, rows of memory cells which do not receive a programming via do not receive power. By selectively providing a programming via to rows in the portion of the memory array configured to store data and withholding the programming via to rows in the portion of the memory array not configured to store data, power is supplied to a minimum number of memory cells for the required memory array configuration.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring logical memory manipulations of logical memory quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit comprising:
an array of memory cells; and
a power bus interconnecting structure, the power bus interconnecting structure including global power buses in communication with local power buses through programmable vias, the programmable vias selectively placed during design of the integrated circuit, and wherein the array of memory cells are remapped so that unused column portions of the memory array become unused row portions of the memory array.

2. The integrated circuit of claim 1 further configured such that each programming via coupling the local power bus to the global power bus provides power to a row of memory cells in the memory array.

3. The integrated circuit of claim 1 further configured with the global power bus is on a higher vertical plane relative to the local power bus.

4. The integrated circuit of claim 1, wherein one or more memory array addresses are remapped from a column basis to a row basis, and the memory array addresses are arranged to maximize contiguous unused rows of memory cells.

5. The integrated circuit of claim 1, wherein a portion of bits of a memory array address is transformed to a row address of the memory array.

6. The integrated circuit of claim 1, wherein a portion of bits of the memory array address is transformed to a column address of the memory array.

7. The integrated circuit of claim 6, wherein a used row portion of the memory array associated with a used column portion of the memory array becomes one of the unused row portions.

8. The integrated circuit of claim 1, wherein the integrated circuit comprises a structured application-specific integrated circuit.

9. An integrated circuit, prepared by a process comprising:
remapping a memory array address so that unused column portions of the memory array are mapped to unused row portions of the memory array; and
selectively placing a plurality of programming vias to couple a local power bus to a global power bus, a position of the programming vias determined by an intersection of the global power bus and the local power bus.

10. The integrated circuit of claim 9, further comprising:
assigning each memory address of a logical memory representation to the corresponding memory array address.

11. The integrated circuit of claim 9, further comprising:
assigning a portion of bits of the memory array address to a row address of the memory array.

12. The integrated circuit of claim 9, further comprising:
assigning the portion of bits of a memory array addresses to a column address of the memory array.

13. The integrated circuit of claim 11, wherein the portion of bits of the memory array address are the eight most significant bits.

14. The integrated circuit of claim 12, wherein the portion of bits of the memory array address are the six least significant bits.

15. The integrated circuit of claim 9, wherein a row of memory cells not in electrical communication with one of the programming vias is unpowered.

16. The integrated circuit of claim 9, wherein the integrated circuit is an embedded memory array within a structured application-specific integrated circuit.

17. An integrated circuit with a memory array, comprising:
a plurality of global power buses disposed in columns coplanar to columns of memory cells in the memory array; and
a plurality of programming vias providing electrical communication between the plurality of global power buses and a plurality of local power buses, each of the plurality of programming vias selectively placed after remapping the memory array to optimize a number of unused rows in the memory array, the remapping occurring during the design of the integrated circuit.

18. The integrated circuit of claim 17, wherein the memory array is initially addressed in a column basis and is remapped to be addressed in a row basis.

19. The integrated circuit of claim 17, wherein the memory addresses are identified as a column-based logical memory representation, resulting in a column address being remapped to a corresponding row address and a row address is remapped to a column address.

20. The integrated circuit of claim 17, wherein a portion of bits of a memory array address is transformed to a column address of the memory array.

* * * * *